United States Patent [19]
Hotchkiss et al.

[11] Patent Number: 5,498,576
[45] Date of Patent: Mar. 12, 1996

[54] METHOD AND APPARATUS FOR AFFIXING SPHERES TO A FOIL MATRIX

[75] Inventors: Gregory Hotchkiss, Richardson; Jules D. Levine, Dallas; Paul R. Sharrock, Plano, all of Tex.

[73] Assignee: Texas Instruments Incorporated, Dallas, Tex.

[21] Appl. No.: 279,320

[22] Filed: Jul. 22, 1994

[51] Int. Cl.⁶ .................................................. H01L 21/60
[52] U.S. Cl. .......................... 437/209; 437/211; 437/214; 437/219; 437/220
[58] Field of Search .......................... 437/209, 211, 437/214, 217, 218, 219, 220, 221, 222; 156/580, 581, 582, 583.1

[56] References Cited

U.S. PATENT DOCUMENTS

| 4,407,320 | 10/1983 | Levine | 136/250 |
|---|---|---|---|
| 4,451,968 | 6/1984 | Jensen et al. | 29/572 |
| 4,614,835 | 9/1986 | Carson et al. | 136/250 |
| 4,691,076 | 9/1987 | Levine et al. | 136/250 |
| 4,872,607 | 10/1989 | Jensen et al. | 228/180.1 |
| 4,917,752 | 4/1990 | Jensen et al. | 156/292 |
| 4,992,138 | 2/1991 | Jensen et al. | 156/644 |
| 5,028,546 | 7/1991 | Hotchkiss | 437/2 |
| 5,091,319 | 2/1992 | Hotchkiss et al. | 437/222 |
| 5,258,331 | 11/1993 | Masumoto et al. | 437/220 |
| 5,281,556 | 1/1994 | Sitimizu et al. | 437/220 |

*Primary Examiner*—Kevin M. Picardat
*Attorney, Agent, or Firm*—Ira S. Matsil; Jsmes C. Kesterson; Richard L. Donaldson

[57] ABSTRACT

An improved method of affixing spheres 4 to a foil matrix 2 is described herein. First, a cell sandwich 32 is prepared. This cell sandwich 32 includes spheres 4 mounted on a foil matrix 2 which are disposed between upper and lower pressure pads 34 and 36. The cell sandwich 32 is then heated (e.g., to about 530° C.). The spheres 4 are then affixed to the foil matrix 2 by directing the cell sandwich 32 through a roll press 48 which compresses the heated cell sandwich 32.

32 Claims, 10 Drawing Sheets

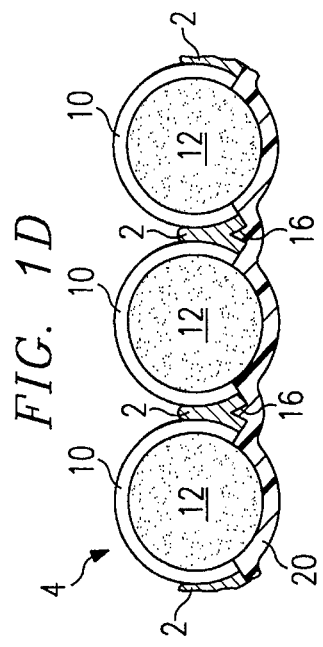
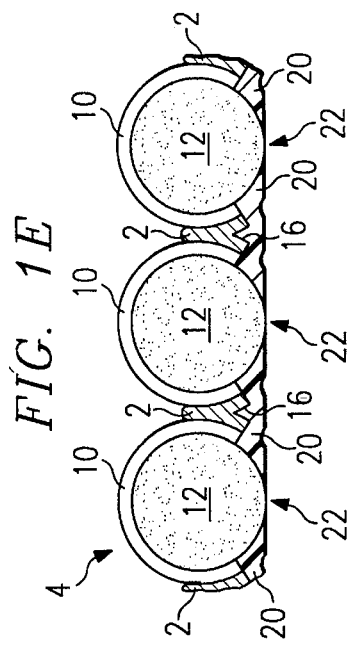
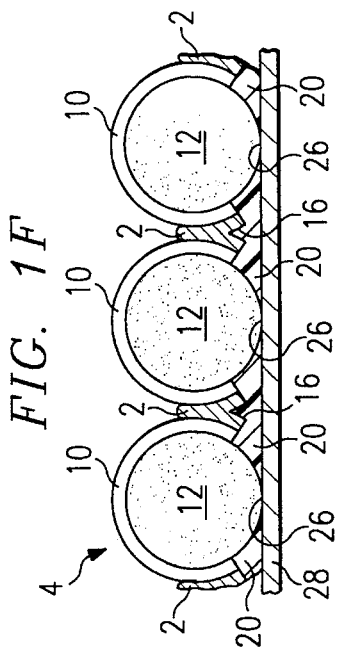
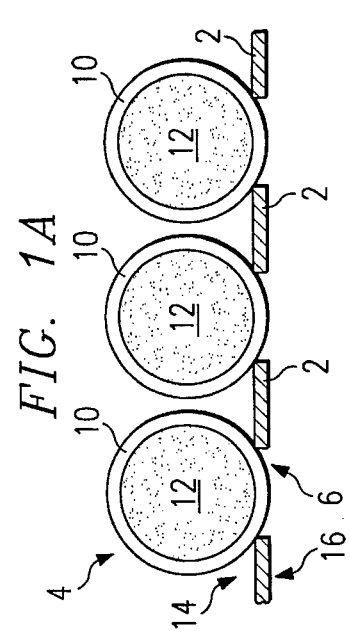
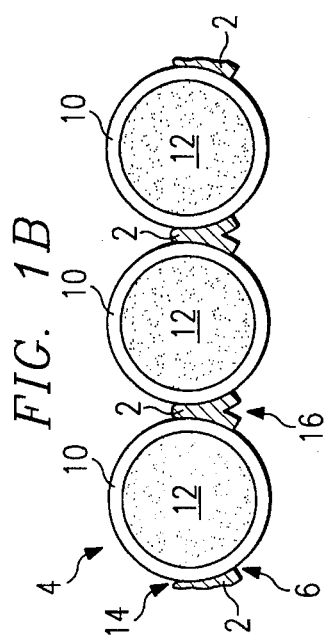
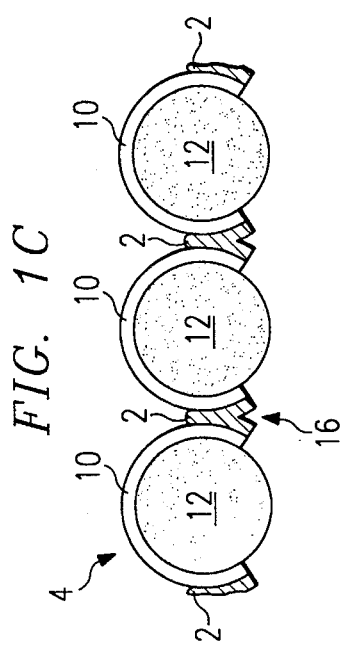

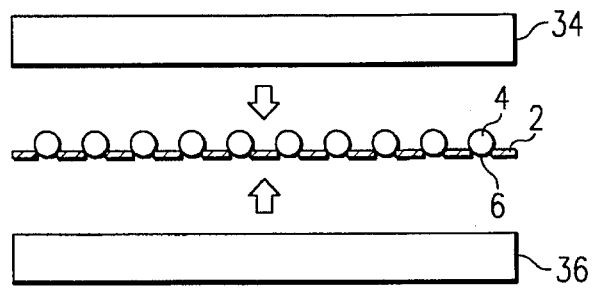
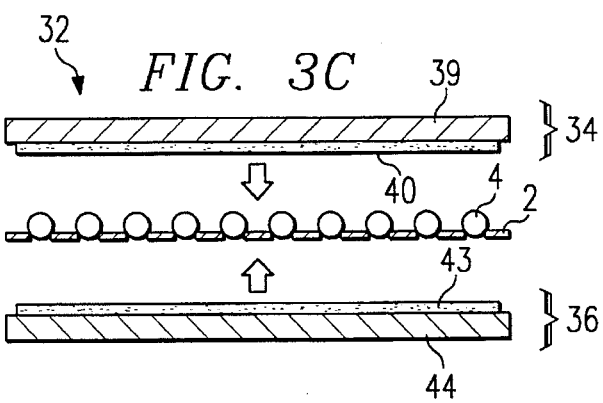
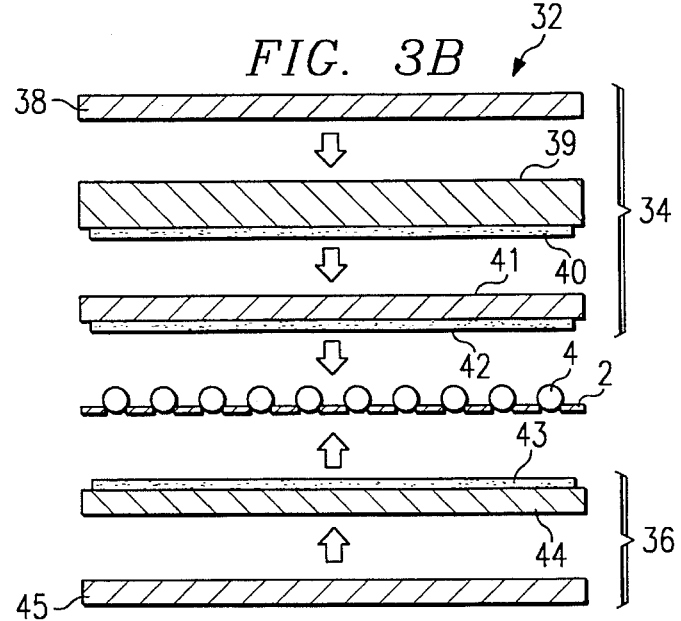

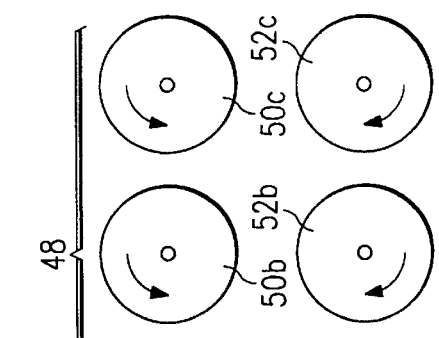
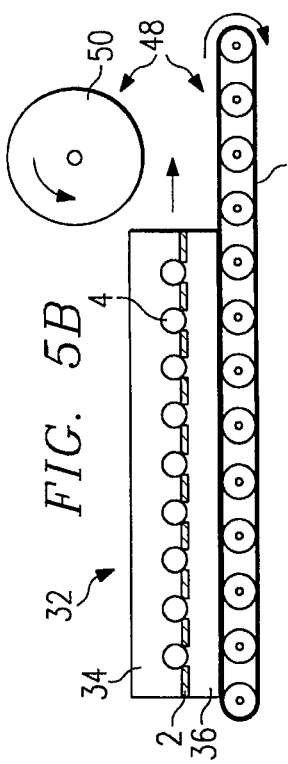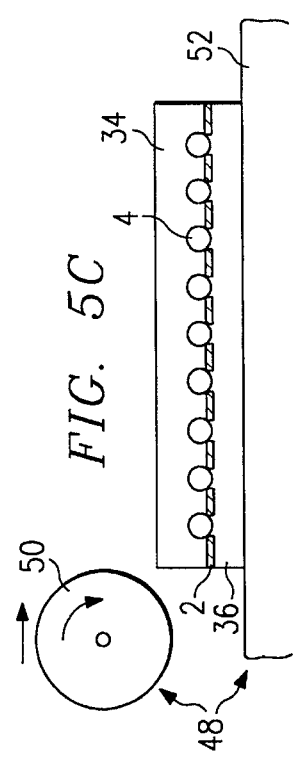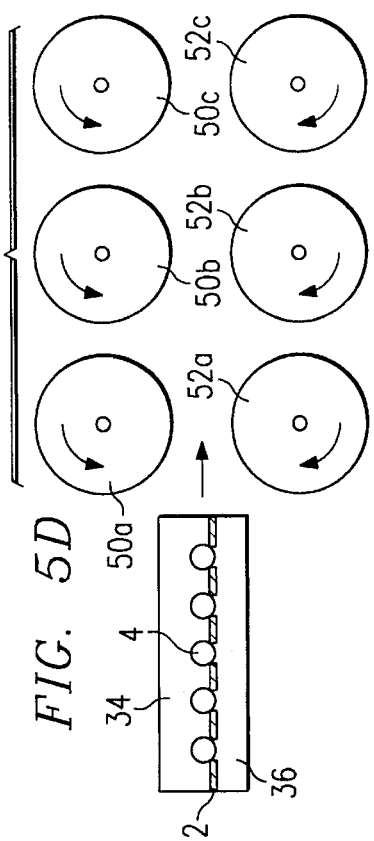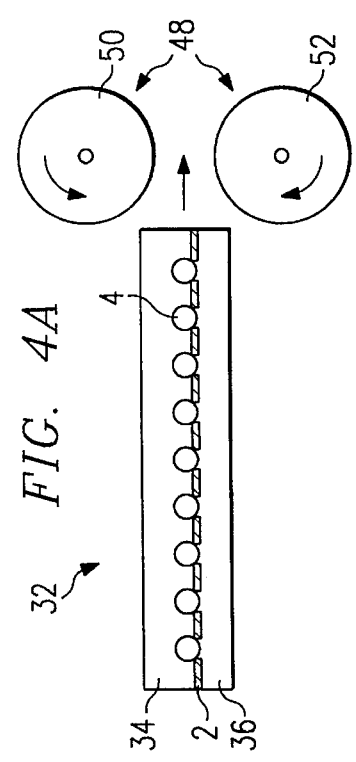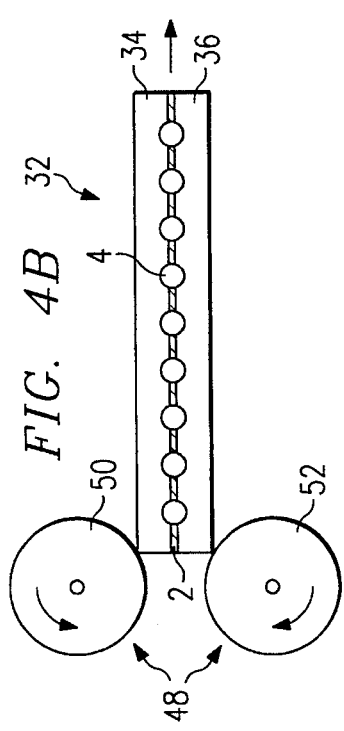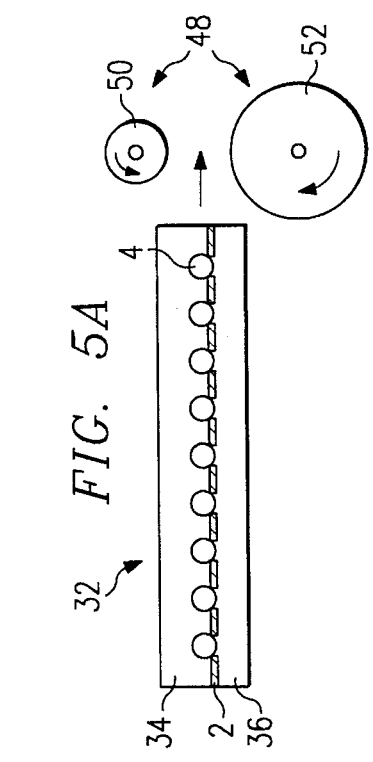

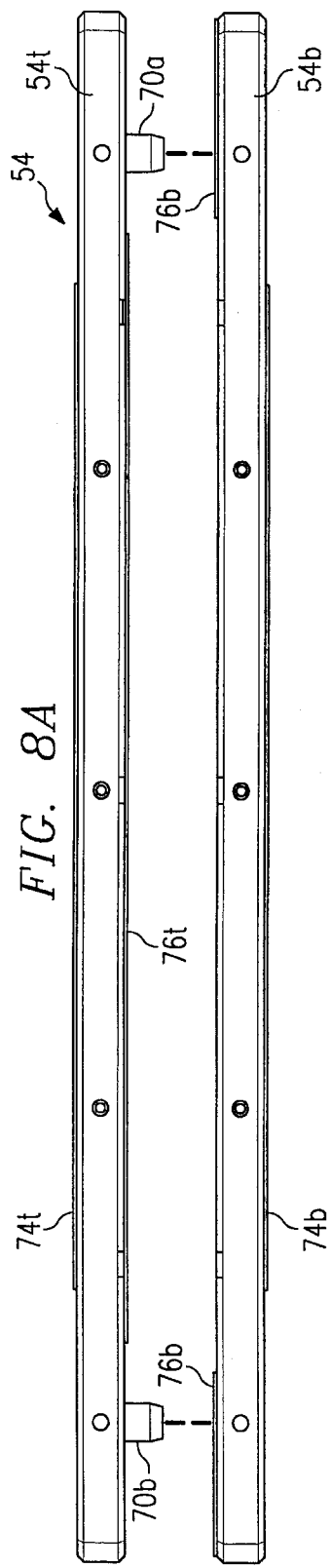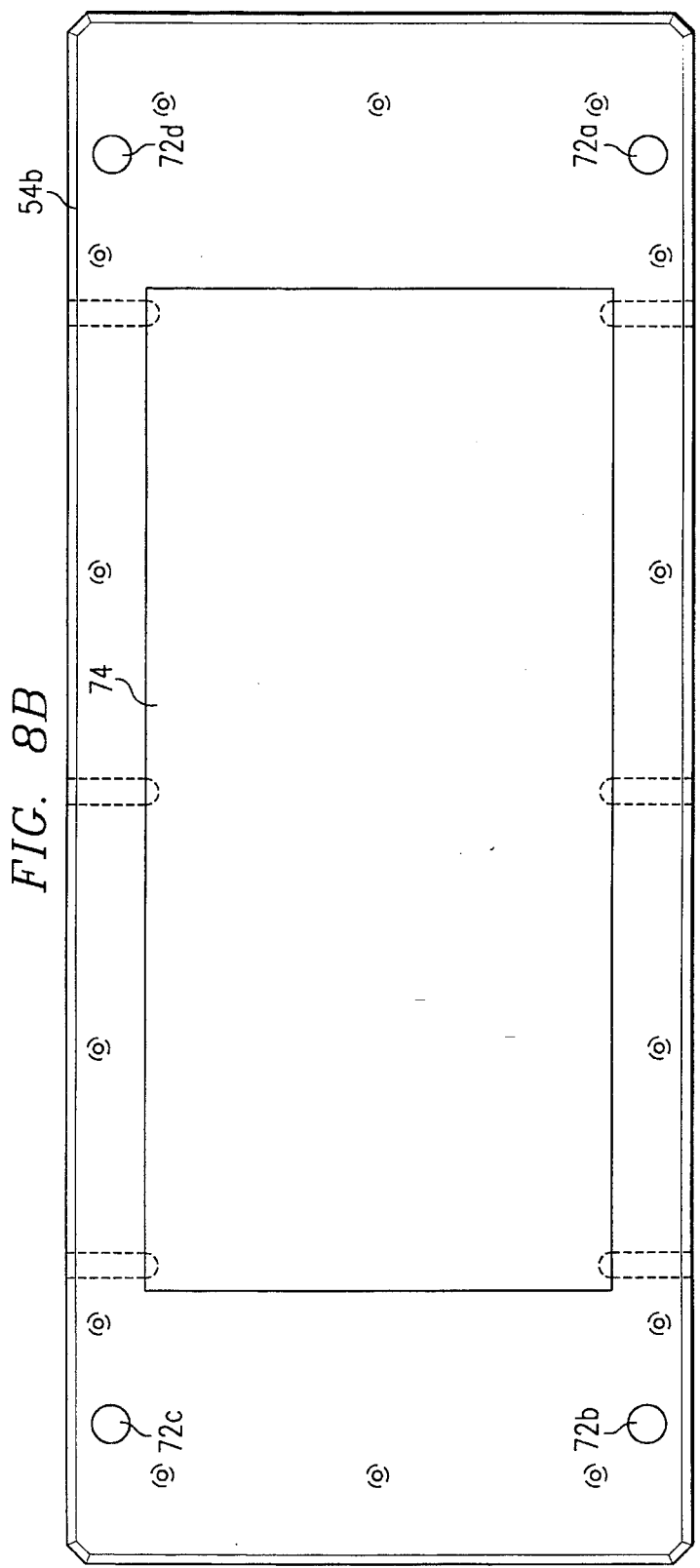
FIG. 8A
FIG. 8B

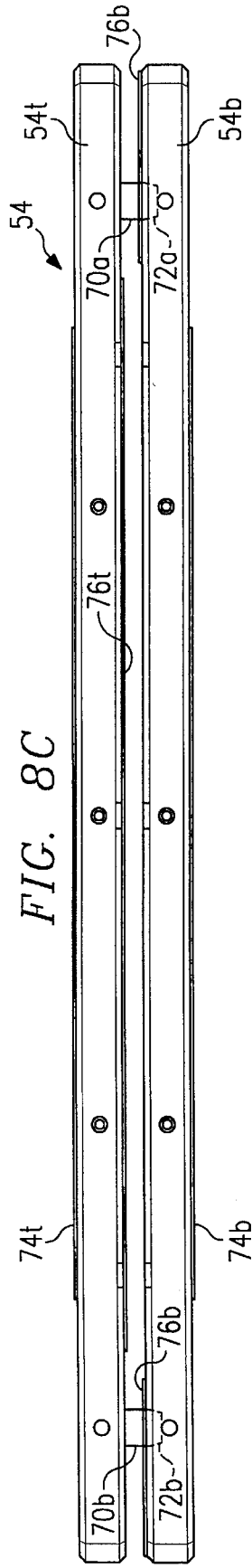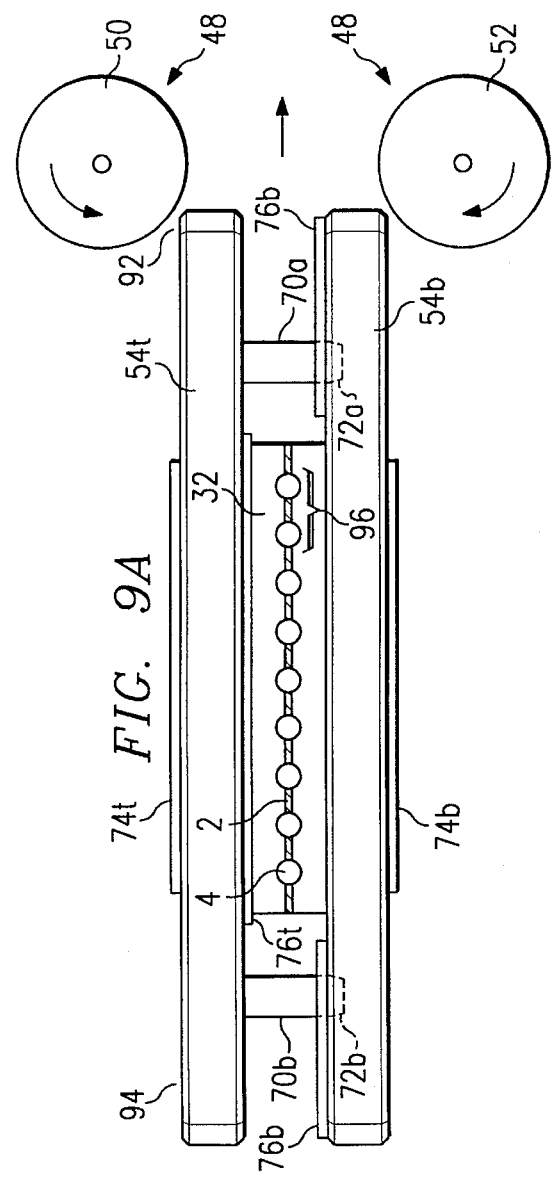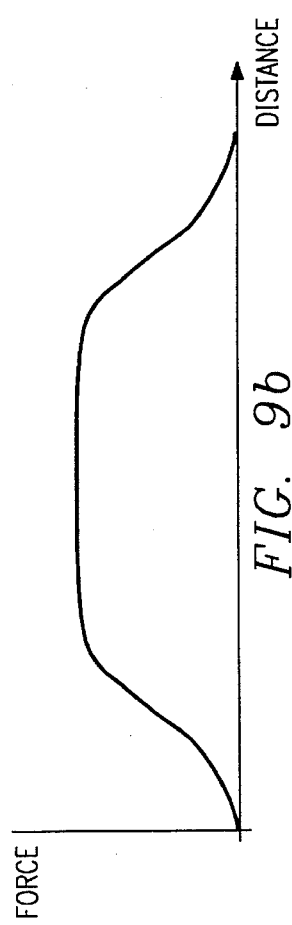

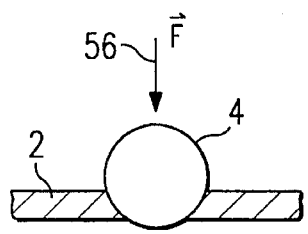
FIG. 10A
(PRIOR ART)
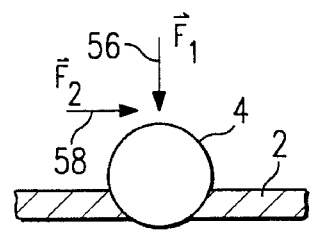
FIG. 10B
FIG. 12A
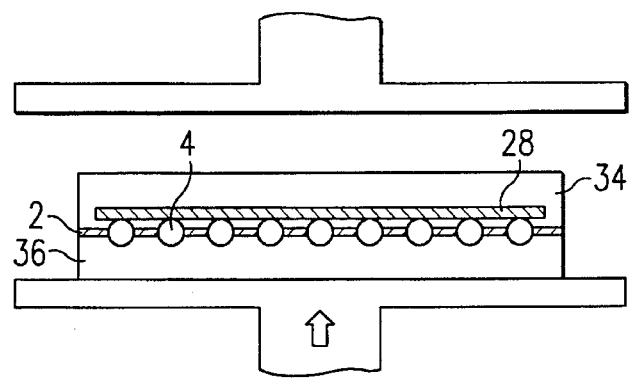
FIG. 12B
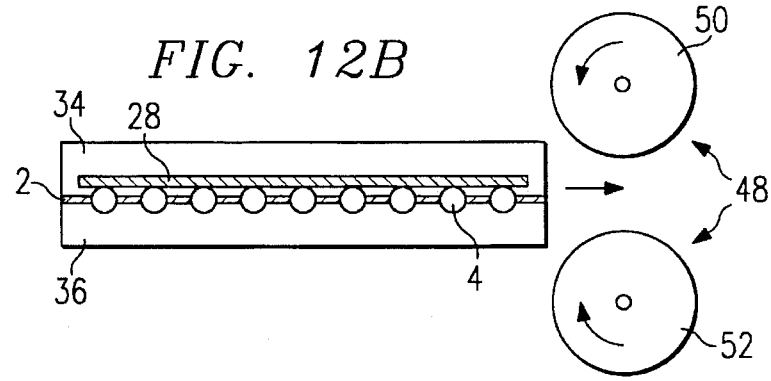

METHOD AND APPARATUS FOR AFFIXING SPHERES TO A FOIL MATRIX

REFERENCE TO RELATED APPLICATIONS

The following U.S. patents and commonly assigned application are hereby incorporated herein by reference:

| U.S. Pat. No. | Filing Date | Issue Date | TI Case No. |
| --- | --- | --- | --- |
| 4,407,320 | 09/08/81 | 10/04/83 | TI-8567 |
| 4,451,968 | 09/08/91 | 06/05/84 | TI-8912 |
| 4,614,835 | 12/15/83 | 09/30/86 | TI-9745 |
| 4,691,076 | 12/02/86 | 09/01/87 | TI-9879B |
| 4,872,607 | 09/26/88 | 10/10/89 | TI-10621B |
| 4,917,752 | 09/11/86 | 04/17/90 | TI-10619A |
| 4,992,138 | 07/31/89 | 02/12/91 | TI-13830 |
| 5,028,546 | 07/31/89 | 07/02/91 | TI-14119 |
| 5,091,319 | 07/31/89 | 02/25/92 | TI-13835 |
| 08/279,572 | 07/22/94 | | TI-19516 |

FIELD OF THE INVENTION

This invention generally relates to the fabrication of semiconductor devices to produce a solar cell and specifically to a method and apparatus for affixing semiconductor members to a foil matrix.

BACKGROUND OF THE INVENTION

A number of systems for converting sunlight to electricity are known. One such system that has proven useful in efficiently producing electricity from the sun's radiation is described in U.S. Pat. No. 4,691,076. In that system, an array is formed of semiconductor particles or spheres. Each sphere has a p-type interior and an n-type skin. A plurality of the spheres are held in a matrix which includes a pair of aluminum foil members which form the contacts to the p-type and n-type regions. The foils are electrically insulated from one another and are flexible. Multiple flexible and conformable arrays can be electrically interconnected to form a module of solar cell elements for converting sunlight or other forms of photon energy into electricity.

In order to produce sufficient quantities of reasonably priced arrays, it is necessary to utilize a process for their manufacture that is uncomplicated, low cost and efficient. An uncomplicated system would be one using currently available technology in such a way that the applicable process steps can be conducted in a highly repeatable manner. Moreover, the less complicated the process steps, generally, the more cost effective will the entire process be carried out. Finally, the more repeatable the process, the more efficiently the operation and the higher the production of solar arrays.

A key process step in the making of silicon solar cells is affixing the silicon spheres to the foil matrix. A known technique for bonding silicon spheres to an aluminum foil is to heat the foil to a temperature slightly below the eutectic point (approximately 570° C.) and then press (or push or drive) the spheres into the foil by using a free falling weight. The free falling weight generates sufficient shearing forces at the silicon and aluminum foil interface to form good adhering bonds.

Drop weight bonding has numerous problems and disadvantages. First, the technique is inherently slow. Second, the drop weight approach does not lend itself to scaling up for larger production volumes. Another problem with drop weight bonding is that distortions in the impact surface of the weight result in undesirable center pressures. Finally, the technique results in too many damaged spheres and shorted cells.

Another method for affixing silicon spheres to a foil matrix is described in U.S. Pat. No. 5,091,319. In that patent, the silicon spheres are pressed into undersized apertures formed through one foil of the foil matrix using a hydraulic press. This method, however, suffers from the deficiency that the spheres throughout the cell are not always uniformly bonded to the aperture walls, especially for larger sized cells.

SUMMARY OF THE INVENTION

An improved method of affixing spheres to a foil matrix is described herein. First, a cell sandwich is prepared. This cell sandwich includes spheres mounted in apertures on a foil matrix which are disposed between upper and lower pressure pads. The cell sandwich is then heated (e.g., to about 530° C.). The spheres are then affixed to the foil matrix by directing the cell sandwich through a roll press (or rolling mill) which compresses the cell sandwich thereby bonding the spheres to the foil matrix.

An advantage of the invention is that it provides a process flow which is more conducive to a continuous throughput. Unlike a vertical press, the foil matrix can be continuously run through the roll press regardless of the length of the cell being produced. This feature enhances manufacturability and therefore reduces costs.

In addition, a roll press provides a more uniform pressure since the forces are applied to a significantly smaller surface area at any given time. Whereas a process using a vertical press applies pressure to the entire cell (or at least a selected portion of the cell) at the same time, a roll press allows the cell to be compressed by compressing a few rows of spheres at a time. It is much easier to uniformly control the pressure along a few rows of spheres than throughout the entire cell.

In addition, the rate of pressure application is important. The faster the force is applied, the better the bond strength will be. Rollers can generally provide faster rates of application compared to a hydraulic press.

BRIEF DESCRIPTION OF THE DRAWINGS

The above features of the present invention will be more clearly understood from consideration of the following descriptions in connection with accompanying drawings in which:

FIGS. 1a–1f are schematic diagrams of the solar cell after each of the processing steps in a general process flow;

FIGS. 3a–3c illustrate variations of preferred embodiment cell sandwiches;

FIGS. 4a and 4b illustrate the rolling process of the present invention;

FIGS. 5a–5d illustrate variations of the roll press which is used in the rolling process of the present invention;

FIGS. 8a–8c illustrate a second embodiment clamshell;

FIG. 9a illustrates a cell being processed using a clamshell as in FIGS. 8a–c;

FIG. 9b illustrates a force profile over distance for a clamshell with a stepped plate;

FIGS. 10a and 10b illustrate the forces applied to the solar cell for prior art device as well as the device of the present invention;

FIGS. 12a and 12b illustrate the preferred method for back bonding the solar cells.

Corresponding numerals and symbols in the different figures refer to corresponding parts unless otherwise indicated.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. A brief overview of the process of forming a solar cell will first be described. A preferred embodiment of affixing a spherical member to a foil matrix will then be described.

Referring to FIGS. 1a–1f, a solar cell is illustrated after selected processing steps in an exemplary process flow.

Initially, as shown in FIG. 1a, a flexible conductive foil 2, or "front foil", preferably aluminum with from about 0.5% to 1.5% (preferably about 1.0%) silicon by weight, of about three mil thickness is provided (herein a mil is one thousandths of an inch). Foil 2 has a native oxide layer (typically about 50 Å in thickness) on its surface due to its exposure to oxygen-containing environments. While the description herein will be with respect to three solar array members or spheres 4, it should be understood that a multiplicity of array members 4 is provided in the total array as is exemplified by the prior art noted above. A completed array of spheres 4 within a matrix which includes foil 2 is referred to as a cell. In other words, a cell comprises a plurality of spheres 4 each coupled to two sheets 2, 28 (FIG. 1f) of conductive foil.

Figure 2A:
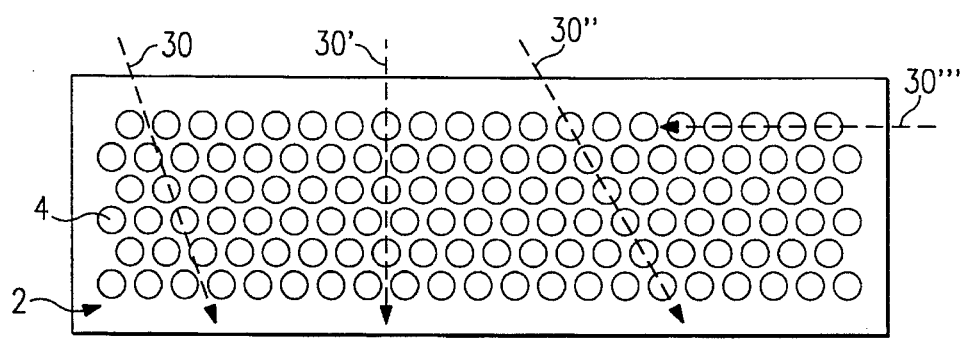
FIG. 2a illustrates the configuration of solar members or spheres formed on a foil matrix.

The aluminum foil 2 may be initially embossed. The embossments may reside in a periodic hexagonal arrangement, on selected centers as illustrated in FIG. 2a. For example, the embossments may reside on 16 mil centers for spheres with 14.5 mil diameters or 32 mil centers for 30 mil diameter spheres. The diameter of the embossed region is slightly smaller than the diameter of doped silicon particles or spheres 4 to be held thereby. The embossments may be circular or any other convenient geometrical shape such as hexagonal or octagonal. In the case of polygonal embossments, a line across the polygon through its center is less than the diameters of the spheres 4 to be applied thereto. Alternatively, the foil 2 can also be stamped or punched to form the holes 6.

The embossed foil 2 is next optionally cleaned to remove organics and is then etched with heated sodium or potassium hydroxide to remove the region of the foil 2 where the thinned embossments reside to provide apertures 6 through foil 2. The etched foil 2 including the plurality of apertures 6 is referred to as a foil matrix.

At this point, the foil 2 can optionally be textured by etching with a fifty percent solution of 39A etchant, which is thirteen percent hydrofluoric acid, thirty-eight percent nitric acid, twenty-one percent acetic acid and twenty-eight percent water, to provide a matrix surface that minimizes back reflections.

An excess of doped silicon spheres 4 are deposited over the frontside 14 of the matrix or foil 2 and negative pressure may be applied to the backside 16 of the foil 2 with a vacuum chuck (not shown) to partially draw the spheres 4 into, and to hold the spheres 4 in, the apertures 6. Because an excess of spheres 4, relative to the number of apertures 6, is preferably initially utilized on the foil 2 frontside 14, all of the apertures 6 will be filled with the spheres 4 and the excess spheres 4 are then removed. Doctoring techniques may be utilized to achieve the foregoing.

Although there is no limit to the size or shape of the members 4 which can be used with the present invention, the members 4 which have been utilized are substantially spherical particles which are about 14 to 34 mils in diameter. The apertures 6 as explained above, have diameters of something less than that of the spheres 4. The spheres 4 preferably include p-doped cores 12 surrounded by an n-doped layer or skin 10. These conductivities may, however, be reversed. Following loading of apertures 6 with the spheres 4, the spheres 4 are then bonded to the walls of the apertures 6, as shown in FIG. 1b.

Referring to FIG. 1b, the sphere 4 may be disposed in the aperture 6 so that its centerline is at or slightly above or forward of the frontside 14 of aluminum foil 2. This disposition of the spheres 4 may be effected by the use of pressure pads 34, 36 (as described herein with respect to FIG. 3) which are disposed above and below the aluminum foil 2 and may be pressed against the foil-sphere 2-4 combination. The pressure pads 34, 36 may be formed of aluminum foil from about 1 mil to about 8 mils thick and coated with a release agent. The pressure pads 34, 36 act as a cushion to mitigate damage to spheres 4 during package deformation. The pressure pads also allow the spheres 4 to move against something compliant. Preferred methods of performing this "front bond" process according to the present invention are discussed in greater detail below with respect to FIGS. 2–6. But first, it would be useful to describe the remainder of the process flow.

FIG. 1b illustrates the foil 2 as being coincident or aligned with the centerline of sphere 4. It should be noted, however, that this is not necessary. In fact, it is desirable for the foil 2 to be sufficiently "below" the centerline to maximize the surface area of the n-type skin layer 10 on which photon energy may impinge. The relationship of the foil 2 depends on the amount of p-type core region 12 which must be exposed "below" the backside 16 of the sheet 2 for bonding to second foil sheet 28 (as in FIG. 1f). It has been practically determined that affixing the foil sheet 2 about 55% of the way "below" the pole of the sphere 4 provides a reasonable tradeoff.

Referring now to FIG. 1c, the rear surface or backside 16 of the foil 2 and the portion of sphere 4 protruding therebelow are then etched using any of planar (18% acetic acid, 52% nitric acid, 26% deionized water, and 4% hydrofluoric acid), hydrofluoric acid/nitric acid mixtures (HF/HNO$_3$), or 39A etchant (approximately 13% hydrofluoric acid, 38% nitric acid, 21% acetic acid and 28% water). As shown in FIG. 1c, the n-type layer 10 on the surface of sphere 4 which is adjacent to rear surface 16 of foil 2 is removed, thereby exposing the p-type region 12. The aluminum foil 2 acts as a mask to the etchant permitting only the portion of the layer 10 which is "below" the rear side 16 of the array to be removed. The n-type skin layer 10 "above" the frontside 14 may also be partially etched after (or simultaneously with) back etch to thin the p-n junction which increases current output of the cell. The array is then rinsed with water to remove etchant. As shown in FIG. 1d, an insulative layer 20, preferably a polyimide coating such as Kapton® or Pyralin® (both available from DuPont), is applied to the backside 16 of foil 2 and to the exposed p-type region 12 of the sphere 4.

In FIG. 1e, a small region of polyimide coating 20 may be removed to expose a portion of the p-type material 12 of sphere 4 through an opening 22. This step may be performed by selective abrasion, such as by passing the cell under a rotating brush with silicon carbide coated (320 grit) bristles. For example, the bristles may be made from nylon, 0.018 inches in diameter and 0.875 inches long. A deburring machine with these bristles is available from Atotech (e.g., Model 604).

In the next step, the array undergoes an anodizing process to isolate shorted members or spheres. In the process, the array is immersed in a diluted hydrofluoric acid (HF) bath with a potential difference of approximately 0.5 volts between the n-type region 10 and the p-type region 12 (i.e., the anode and cathode). The anodization process takes approximately 30 to 120 seconds to provide a sufficient insulative coating (not shown) on the exposed p-type core 12 of a shorted sphere 4. This insulative coating isolates the sphere 4 from a back foil 28 (see FIG. 1f).

After the anodization process, a titanium dioxide coating (not shown) is formed on the n-type skin 10 of spheres 4. The titanium dioxide coating serves as an anti-reflection coating. Other materials can also be used as anti-reflection coatings.

In FIG. 1f, a thin aluminum foil 28, or "back foil", of about 0.3 to 1.0 mil thickness is then positioned under each of the spheres 4. The aluminum and cell package 2-4-28 is heated to a temperature in the range of about 350° to 450° C., preferably about 420° C. The heated foil 28 is then pressed against the contact 26 or the exposed p-type core 12 to bond them together.

In one embodiment of the present invention, the foil 28 is bonded directly to the sphere 4. In other words, the electrical contact 26 is integral with the foil 28. This process replaces the two step sequence of bonding the electrical contact 26 to sphere 4 and then bonding the foil 28 to the electrical contact 26 as described in U.S. Pat. No. 5,028,546. This so-called back bond process will be described in further detail below with respect to FIGS. 11 and 12.

A preferred embodiment front bond process of the present invention is now described with reference to FIGS. 2 through 10. As previously discussed with respect to FIG. 1a, a front foil 2 is provided. Referring to FIG. 2a, the foil matrix 2 includes a plurality of undersized apertures 6 in which the spheres 4 will be affixed. The apertures may be formed in rows as denoted by reference numerals 30, 30', 30" and 30''' which illustrate four of the different ways in which a "row" can be defined. In the preferred embodiment, the apertures 6 are formed in a periodic hexagonal arrangement as illustrated in FIG. 2a. This arrangement maximizes the density of spheres 4 on the foil 2.

Figure 2B:
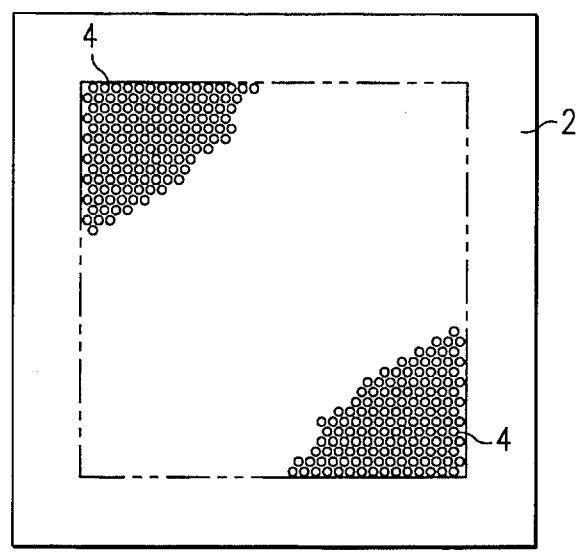
FIGS. 2b–2c illustrate two of the solar cell shapes produced by the steps outlined in FIGS. 1a–1f.
Figure 2C:
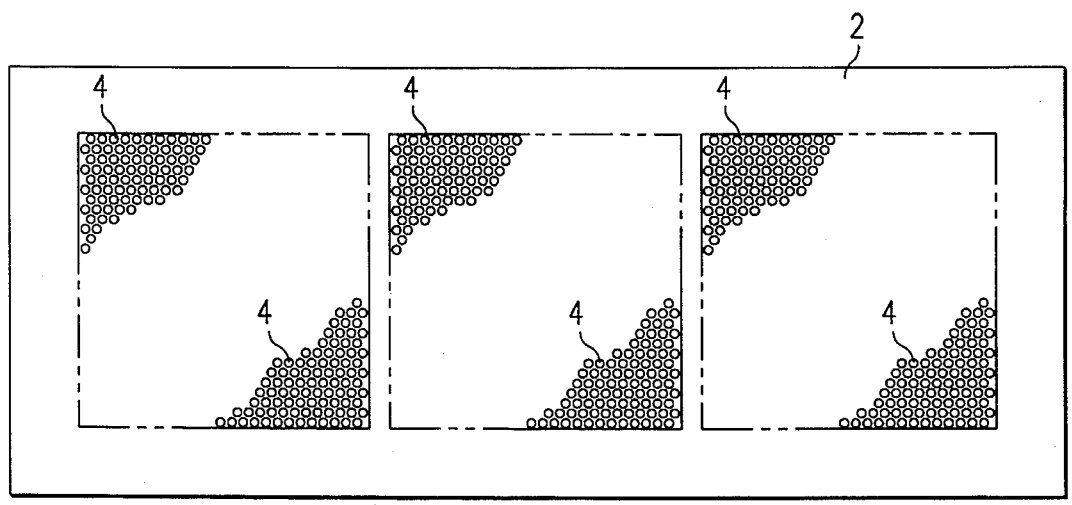

Several solar cell shapes having aperture areas arranged in a periodic hexagonal pattern have been successfully built and tested. The planar aperture areas have ranged in size from 0.1 cm$^2$ to 300 cm$^2$. FIG. 2b shows an example of a single cell design. In a typical application, a cell such as the one in FIG. 2b may have dimensions of 3.16 cm×3.16 cm (10 cm$^2$) or 10 cm×10 cm (100 cm$^2$). FIG. 2c illustrates a second variation that contains three 10 cm×10 cm (300 cm$^2$) cells contiguously arranged on a single foil matrix 2.

Each sphere 4 is preferably affixed to the foil 2 so that its perimeter is bonded to the foil 2. To do this, each sphere 4 is physically pushed into an undersized aperture 6 in the foil 2, preferably by subjecting the foil-sphere 2-4 combination to compression.

To facilitate utilization of the compression process, a cell sandwich 32 is formed as illustrated in FIG. 3a. The cell sandwich 32 comprises an upper pressure pad 34, a lower pressure pad 36 and the foil 2 (containing spheres 4 in the apertures 6). The pressure pads 34 and 36 allow the spheres to move against something compliant during the compression process. The pressure pads will also help prevent damage to both the sphere 4 and the foil 2.

Referring to FIG. 3b, the upper pressure pad 34 may comprise first and second thin, robust, compliant sheets 39 and 41 which may be a metal such as aluminum. Both compliant sheets 39 and 41 also preferably include release coat layers 40 and 42, respectively. The release coat layer is a relatively thin (about 0.010" or less in thickness) coating either applied or formed on the base material of the pressure pads to prevent the pressure pad from either adhering or sticking to other materials, particularly other parts of the cell sandwich 32 such as the foil matrix 2 and silicon spheres 4. Also mechanically abrading and/or chemically etching the pressure pads to modify their surface finish or surface topography may by itself or in combination with the release coat layers assist in preventing the adherence of other materials.

The release coat layers 40 and 42 may comprise plaster (e.g., calcium sulfate $CaSO_4$). The lower pressure pad 36 may include a compliant sheet 44, preferably aluminum, which includes a release coat layer 43, typically plaster. Although not illustrated, it should be noted that both sides of compliant sheets 39, 41 and 44 can be coated with release coat layers.

One or all of the aluminum sheets 39, 41 and 44 may have an oxide layer (not shown) formed thereon. If present, the oxide layer (not shown) may typically be about 20 to 120 micro-inches thick.

The cell sandwich 32 also includes upper and lower oxidized stainless steel sheets 38 and 45. The steel sheets 38 and 45 are provided to prevent the aluminum sheets 39 and 44 from bonding to a sandwich holder called a "clamshell" (labeled 54 in FIG. 6a). If a clamshell is not used, the steel sheets 38 and 45 may be omitted. A satisfactory oxide thickness can be grown on the stainless steel sheets 38 and 45 by heating the sheets in air in a furnace or oven controlled to about 500° C. for about twenty minutes.

The dimensions of the elements of the pressure pads 34 and 36 illustrated in FIG. 3b are tabulated in Table 1. It should be noted that these dimensions are exemplary only. In this example, the compliant sheets 39 and 44 comprise oxidized aluminum sheets.

TABLE 1

| Pad | Element | Dimensions (inches) |
|---|---|---|
| Upper Pad 34 | Stainless steel 38 (oxidized) | 6.0 × 14.375 × 0.002 |
| | Aluminum 39 (oxidized) | 6.0 × 14.375 × 0.008 |
| | Oxide on Aluminum 39 | ~0.00008 thick |
| | Plaster 40 | 4.875 × 13.25 × 0.003 ± |

TABLE 1-continued

| Pad | Element | Dimensions (inches) |
|---|---|---|
| | | 0.0005 |
| | Aluminum 41 | 4.875 × 13.25 × 0.001 |
| | Plaster 42 | 4.375 × 12.625 × 0.0015 ± 0.0005 |
| Lower Pad 36 | Plaster 43 | 4.875 × 13.25 × 0.003 ± 0.0005 |
| | Aluminum 44 (oxidized) | 6.0 × 14.375 × 0.008 |
| | Oxide on Aluminum 44 | ~0.00003 thick |
| | Stainless steel (oxidized) | 6.0 × 14.375 × 0.002 |

In one embodiment, the upper pressure pad 34 includes two aluminum sheets 39 and 41 and the lower pressure pad 36 includes a single aluminum sheet 44. It should be noted, however, that the present invention anticipates that other numbers of layers be used. For example, an alternate embodiment cell sandwich 32 is illustrated in FIG. 3c. In this embodiment, the upper pressure pad 34 includes an oxidized aluminum sheet 39 (e.g., 6.0"×14.375"×0.008" in dimension) with a plaster release coat 40 (e.g., 4.875"×13.250"×0.003"+0.0005" in dimension). The lower pressure pad 36 includes an oxidized aluminum sheet 44 (e.g., 6.00"×14.375"×0.008" in dimension) with a plaster release coat 43 (e.g., 4.875"×13.250"×0.005"± 0.0005" in dimension). The oxide layers formed on both aluminum sheets 39 and 44 are about 3 μm (120 μinches) thick. In this embodiment, no stainless steel sheets are used. The oxide layer on the sheets 39 and 44 will prevent the sheets 39 and 44 from bonding to the clamshell.

Although described herein as comprising aluminum sheets 39, 41, 44 with plaster release coats 40, 42, 43, the pressure pads 34 and 36 may consist of a wide variety of materials. Generally, the materials should possess as many of the following characteristics as possible: 1) be able to withstand the necessary temperatures (e.g., 550° C. or above) without decomposing or losing structural integrity, 2) possess deformation characteristics comparable to aluminum, 3) be available at low cost, 4) prevent sticking to the spheres 4, foil matrix 2, other pressure pads, and clamshell, for example, by allowing plaster or other release agents to adhere or permit formation of oxide release coatings, 5) withstand compressive forces/pressure required without structural failure, 6) exhibit no outgassing at the temperature of interest, and 7) possess thermal expansion characteristics comparable to aluminum.

In another alternate embodiment, the release coat layer(s) 40, 42 and/or 43 may be constructed by mixing 20 ml printer's ink, 20 ml ethylene-glycol, 6 grams of boron nitride and 6 grams of silica. Additional ethylene-glycol can be mixed in the foregoing to achieve the desired consistency. Alternate materials for the release coat layers include, but are not limited to, ceramic coatings such as aluminum oxide ($Al_2O_3$), magnesium oxide (MgO), and titanium dioxide ($TiO_2$). In addition, the pressure pads 34, 36 can include a layer of compressed graphite (not shown). The compressed graphite layer could comprise, for example, an off-the-shelf product such as Grafoil™ produced by Union Carbide.

To affix the spheres 4 to the foil 2, the cell sandwich 32 is first heated. In the preferred embodiment the temperature is between about 500° C. and about 540° C., preferably about 530° C. The upper temperature is limited only by the temperature at which the aluminum mobility increases so that it spikes into the p-type core 12 thereby shorting the cell member. Once the cell sandwich 32 reaches the desired temperature, the spheres 4 are affixed to the foil 2 by directing the cell sandwich 32 through a roll press 48 as illustrated in FIGS. 4a–4b. The cell sandwich 32 is compressed between a top roller 50 and a bottom roller 52. The combination of the pressure applied by the roll press 48 and the elevated temperature of the spheres 4 and foil 2 will cause the sphere 4 to become bonded to the foil 2.

In an alternate embodiment, the cell sandwich 32 is compressed while still at room temperature. The foil matrix 2 (including spheres 4) can later be heated to complete the bonding process. This alternative provides a significant advantage since the compression process can be performed at room temperature.

In the preferred embodiment, the rollers 50 and 52 have the same diameter which is typically about 10 inches. In general, the diameter of roller 50 (or 52) may vary between about 3 and 18 inches depending on the amount of force required. The process, however, is limited by the size of the rollers 50 and 52. A smaller diameter is typically preferred since when the diameter is small, only a point contact will exist between roller 50 (or 52) and the cell sandwich 32. This feature provides an advantage as will be described below. However, rollers that are too small may impart an undesirable curl or deformation to the cell sandwich 32 as it exits roll press 48. Also the size of the rollers should be commensurate with the force required as the force applied by larger rollers is oftentimes more difficult to control.

It is important that the rollers 50 and 52 be parallel to one another so that each sphere within the row is compressed with the same amount of pressure. In the preferred embodiment, if the cell sandwich 32 (including clamshell 54 as in FIG. 6a) is about 1.080 inches thick, the rollers 50 and 52 will typically be about 1.010 inches apart. This gap setting takes into account about 0.025 inch worth of play that exists in the roller bearings. This configuration will cause about 24,000 pounds of force to be applied to a portion of the sandwich 32 thereby compressing the spheres 4 into the foil matrix 2. It is anticipated that a process not using a clamshell 54 would require much less force for compressing the spheres 4 into the foil matrix 2.

Although illustrated in FIGS. 4a and 4b as including two rollers 50 and 52 of equal radius, the roll press 48 may include a variety of configurations. Four of these variations are illustrated in FIGS. 5a–5d.

In FIG. 5a, the top roller 50 has a smaller radius than that of bottom roller 52. In an another embodiment (not illustrated), the radius of bottom roller 52 may be smaller than that of top roller 50. It should be noted that the tangential velocities of the two rollers 50 and 52 are substantially equal so the cell package 32 is guided by the same speed at the top and bottom.

In the embodiment of FIG. 5b, the cell sandwich 32 is placed on a belt-conveyor or similar facility 52 and guided beneath top roller 50. This embodiment illustrates that only one roller may be used. Expanding upon that principle, FIG. 5c illustrates an embodiment where the cell package 32 is stationary and the roller 50 is moved over the cell package. In another variation, a heating element (not shown) can be included within the conveyor belt 52 (FIG. 5b) or surface 52 (FIG. 5c) for maintaining the high temperature of the cell sandwich 32.

Finally, FIG. 5d demonstrates that the roll press 48 can include more than one top roller 50a–c and/or bottom roller 52a–c. Each of these rollers can have the same radius or varying radii. These type of roll presses may be referred to as tandem rolling mills.

The present invention provides a number of advantages over the prior art. In the preferred embodiment, only a few rows 30–30''' (see FIG. 2a) of spheres 4 are compressed at a time. In this manner, the pressure applied to the spheres 4 can be better controlled since the effective surface area being compressed at any given time is relatively small. In fact, as the diameter of the rollers 50 (or 52) is decreased, the surface area of contact will decrease further enhancing this characteristic. It is anticipated, however, that the present invention could utilize rollers which have a diameter of 15 inches or greater.

As discussed above, FIG. 2a illustrates four possible definitions of a row 30 (or 30' or 30" or 30''') of spheres 4. It should be noted that a row can be defined by a line crossing the foil 2 at any angle. In other words, a row might only include as little as a single sphere if the particular line which defines the row crosses only that one sphere.

Figure 6A:
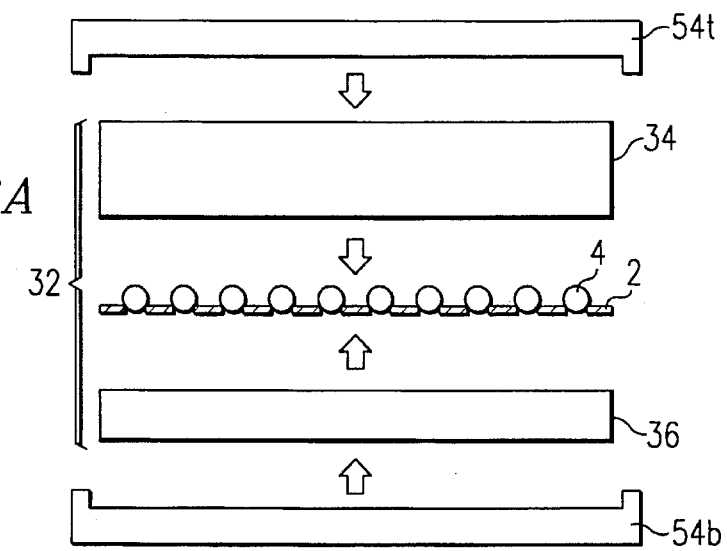
FIGS. 6a–6c illustrate three variations of a cell sandwich formed within a clamshell.
Figure 7A:
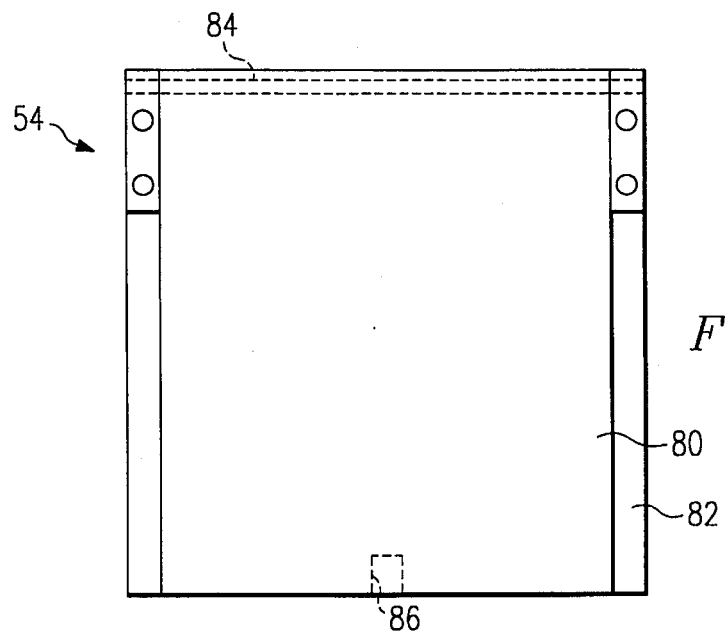
FIGS. 7a–7e illustrate a first embodiment clamshell.
Figure 7B:
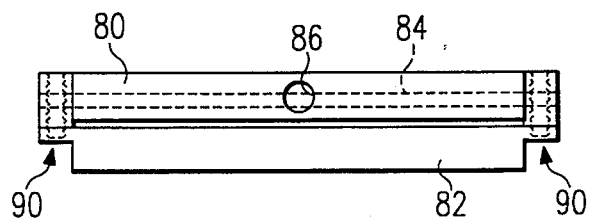
Figure 7C:
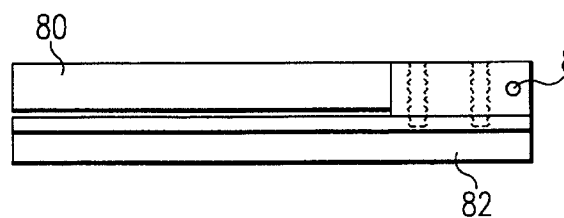
Figure 7D:
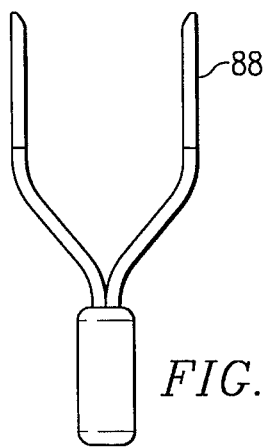
Figure 7E:
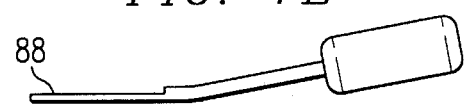

Referring now to FIG. 6a, in the preferred embodiment, the cell sandwich 32 is disposed within a "clamshell" 54 before being directed through the roll press 48. In this context, a "clamshell" refers to any fixture which includes a top plate 54t and a bottom plate 54b and encloses the cell sandwich 32 during the compression step. As illustrated in FIGS. 7a–7c, the clamshell 54 can include a hinged fitting connecting the top and bottom plates 80 and 82 (thus the name "clamshell"). However, as illustrated in FIGS. 8a–8c, clamshells which do not include the hinge have also been designed. Using a clamshell-like fixture in connection with a roll press may be referred to as "book rolling".

Figure 6B:
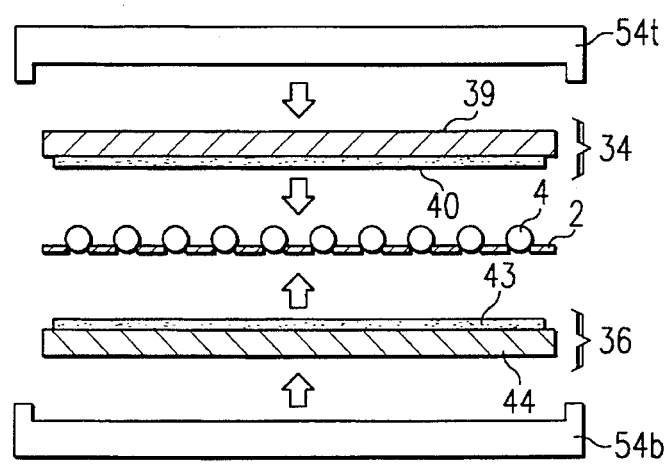

Returning to FIGS. 6b and 6c, two of the many possible cell sandwich 32 configurations are illustrated. Referring first to FIG. 6b, upper pressure pad 34 includes compliant sheet 39 and release coat 40. In the preferred embodiment, the compliant sheet 39 is aluminum and the release coat 40 is plaster. Lower pressure pad 36 includes compliant sheet 44 and release coat 43. Once again, the compliant sheet 44 may comprise aluminum and the release coat 43 may comprise plaster. As discussed above, other materials may be used.

The portion of clamshell top plate 54t and bottom plate 54b which contacts the cell sandwich 32 may be covered with a release coating (not shown) which will prevent the cell sandwich 32 from sticking to the clamshell 54 during the heating and compression steps. For example, the clamshell 54 can be coated with a ceramic-like or similar coating, such as aluminum nitride (AlN), boron nitride (BN), titanium nitride (TiN), or chromium carbide (CrC), as examples. These coatings may impede an aluminum sheet (e.g., 39 or 44) from sticking to a steel clamshell.

Likewise the surface finish or surface topography of the clamshell may also be modified by, for example, mechanical abrasion and/or chemical etching to prevent the cell sandwich 32 from sticking to the clamshell 54. This surface modification may be used singly or in combination with a variety of release coatings to prevent the sticking.

Figure 6C:
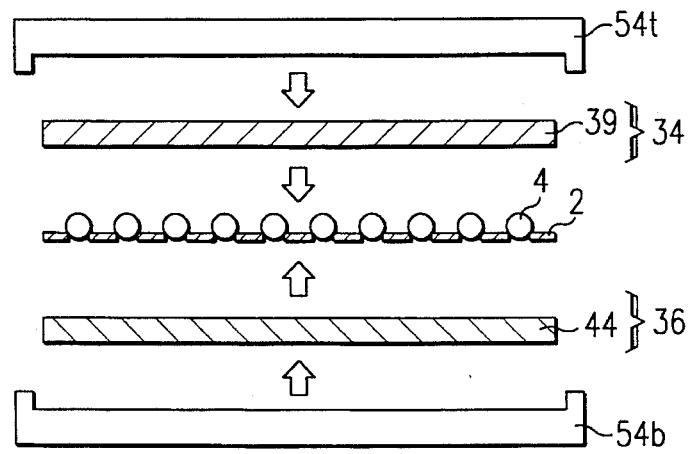

An alternate embodiment is illustrated in FIG. 6c which is similar to the embodiment of FIG. 6b except that the aluminum sheets 39 and 44 have been oxidized and the plaster coatings 40 and 43 have been eliminated. A ceramic coating (not shown) can be formed on the clamshell 54 as described above.

The clamshell 54 typically comprises a hard, thermally conductive material such as steel. Steel alloys such as D2, M2 and H13 have been tried successfully. Other materials, such as stainless steel, inconel, titanium and tungsten, may also be good candidates. In the one embodiment, the clamshell 54 comprises a top plate and a bottom plate each of which are about twenty inches long by eight inches wide by one half inch thick. However, these dimensions may be varied according to the size of the foil 2. A more detailed drawing of two alternate clamshells 54 is shown in FIGS. 7a–7e and 8a–8c.

Referring now to FIGS. 7a–7e, a first embodiment clamshell 54 is illustrated. This "hinged" clamshell 54 may be used for bonding 10 cm$^2$ cells as in FIG. 2b. The clamshell 54 comprises two hardened (e.g., $R_C$=65 where $R_C$ is Rockwell C hardness) steel plates 80 and 82 connected at the back by a steel hinge 84. The cell sandwich 32 may be placed between the top plate 80 and the bottom plate 82. The clamshell 54 may be opened by inserting a rod (not shown) into hole 86 and raising top plate 80 away from bottom plate 82. Transportation of clamshell 54 between a heating source and roll press (and vice versa) can be facilitated by inserting a tongued fork 88 (illustrated in FIGS. 7d–7e) underneath overhang 90 of bottom plate 82.

A second embodiment clamshell 54 is illustrated in FIGS. 8a, 8b and 8c. This clamshell may be used for bonding 300 cm$^2$ arrays (e.g., as in FIG. 2c), for example. Top plate 54t includes four pins (two of which are illustrated in FIG. 8a and denoted as 70a and 70b) and bottom plate 54b includes recesses 72a–d (as illustrated in FIG. 8b). The pins 70 are aligned so that they will fit within recesses 72 when the clamshell plates 54t and 54b are fit together as illustrated in FIG. 8c. In an alternate embodiment, only two pins which fit in corresponding recesses (e.g., 72a and 72c) may be used.

As illustrated in FIG. 6a, the cell sandwich 32 will fit between top plate 54t and bottom plate 54b during the compression process.

Returning to FIG. 8a, the clamshell 54 includes a number of features which enhance the performance of the bonding process using the roll mill 48 (FIGS. 4a–b and 5a–d). For instance, top plate 54t includes a step 74t on the outside of the plate. Similarly, bottom plate 54b includes a step 74b on the outside of the plate. However, the bottom plate 54b may not need a step 74b as tests have shown acceptable bonding with a stepless bottom plate 54b.

Each plate 54b and 54t also includes a steel shim 76b and 76t, respectively. In one embodiment, the shims 76t for top plate 54t may be 14.2"×0.5"×0.048" and are positioned longitudinally on the underside of both sides (only one shim 76t is illustrated in FIG. 8a). In this example, the bottom plate shims 76b may be 7.80" ×2.1"×0.062" and may be placed on the inside surface of the leading and trailing ends of bottom plate 54b as illustrated in FIG. 8a.

Referring to FIG. 9a, tests were made using a clamshell 54 which did not include steps 74a and 74b or shims 76t and 76b. In this case, the roll press 48 contacted the clamshell 54 at its leading edge 92. This action, along with the effects from the thickness of the cell sandwich 32, caused the upper and lower plates 54t and 54b to separate at the trailing end 94 thereby damaging the first few rows 96 of spheres 4 due to excessive pressure on these rows. Attempts at decreasing the force to avoid this damage resulted in incomplete bonds of the spheres 4 reaching the rollers 50 and 52 later in time.

The addition of the step 74 and shims 76 to the clamshell 54 has helped to eliminate this problem. In one embodiment, the edge of the step 74 is directly overhead of the first row of spheres 4. This approach delays application of pressure to the clamshell 54 and together with the shims 76 compensates for the thickness of the cell sandwich 32. The cell sandwich 32 resides inside the boundary formed by shims 76t and 76b. With both the step 74 and shims 76 functioning to minimize the amount of plate separation at the trailing end 94, the magnitude of the forces applied to the first spheres are lowered to a level where no damage occurs, but yet bonding of the spheres 4 to the front foil 2 occurs. A typical force profile along the length of the cell package for a clamshell comparable to the one in FIGS. 8a–8c is illustrated in FIG. 9b.

The benefits derived by the trailing end 94 from the inclusion of the step 74 and shims 76 to the clamshell 54 also applies equally well to the leading edge 92.

When performing the affixing process, the clamshell 54 is typically preheated to avoid the relatively long time it would take to heat a structure with a high thermal mass. In the preferred embodiment, the clamshell 54 is held at about 450° C. to 510° C. The temperature should be held as close to the bond temperature as possible. The cell sandwich 32 is then loaded in at room temperature and the combination is then heated to the desired process temperature, e.g., 530° C. In an alternate embodiment, the cell sandwich 32 is preheated (e.g., to 200° C. to 550° C.) before insertion into clamshell 54. This step has proven useful in minimizing sphere movement because pads move (or shift) less when closer in temperature to clamshell 54.

In an alternate embodiment, the rollers 50 and 52 may be heated. Heating the rollers 50 and 52, to about 500° C. for example, may greatly facilitate bonding without a clamshell 54. The heated rollers would help to keep the cell sandwich hot.

In another alternate embodiment, release coat layers may be applied or formed on the rollers 50 and 52 to prevent either the cell package 32 (when not using a clamshell) or the clamshell 54 from sticking or clinging to the rollers. As mentioned previously, the surface texture of the rollers can also be modified by, for example, mechanical abrasion and/or chemical etching to further aid in preventing this sticking.

The rollers 50 and 52 described above are typically cylindrical in appearance. In yet another alternate embodiment, these cylinder-like rollers can be shaped to include a wide variety of configurations. For example, a step can be machined into the top and/or bottom roller(s) 50/52, much like the step 74t (74b) included on the clamshell 54. This roller configuration may allow the use of flat, non-stepped clamshells. Different roller shapes may also prove useful when bonding without a clamshell 54. As another enhancement, the width of the rollers 50 and 52 can be selected to match, for example, the width of the cell in the case of no clamshell bonding or the width of the step in clamshell bonding.

At this point in time, the cell sandwich 32 can be directed to the roll press 48 for the compression process.

Reference should now be made to FIGS. 10a and 10b. In prior art processes which utilize a vertical press to compress the spheres 4 into the foil 2 (as in U.S. Pat. No. 5,091,319), the force F applied to the sphere (as denoted by reference numeral 56 in FIG. 10a) includes primarily a radially inward component in the direction normal to the plane of the foil 2. In the method using the roll press 48, however, the force may include both a radially inward component $F_1$ in the direction normal to the plane of the foil 2 and a tangential component $F_2$ in the direction parallel to the plane of foil 2. These forces are denoted by reference numerals 56 and 58 in FIG. 10b. Although it would appear that the tangential component 58 would harm the process, it has been experimentally shown that these forces can be minimized with the use of a carefully designed clamshell 54. A process which does not make use of a clamshell may have to change, for example, the composition of the cell package 32 and/or the design of the roll press 48 in order to overcome the detrimental effects of the tangential component 58. While it would appear at first glance that a process utilizing a roll press would be unacceptable, we have discovered that the process can be made to work with the use of a clamshell. In fact, experimental evidence has shown that the roll press outperforms the vertical press. The following discussion provides the highlights of this experimentation.

In the past, the thermal bonding of the aluminum matrix 2 to the silicon spheres 4 of the spherical solar cells was made using a vertical press with heated platens. This bonding step of the cell assembly process can be called the "front bond" and is one of the major steps in that process. The front bonds of both 10 $cm^2$ and 100 $cm^2$ cells (i.e., cells with a surface area of 10 $cm^2$ and 100 $cm^2$, respectively) can be made with four-poster presses having maximum pressing forces of 30 tons and 200 tons, respectively, and temperature control to 600° C. This method of forming front bonds is described in U.S. Pat. No. 5,091,319 ('319).

An improved means of affixing the silicon spheres to the aluminum foil has been successfully completed by using a two high rolling mill (e.g., roll press 48 in FIGS. 4a and 4b) in place of the vertical hydraulic press. The roll press (48) used for these initial tests is the same as the rolling mill used for the book roller embossing of the aluminum foils which has been described in U.S. Pat. No. 4,992,138.

A cell sandwich (e.g, a 10 $cm^2$ cell sandwich 32 as in FIG. 6a) was loaded and inserted into a clamshell (e.g, clamshell 54 in FIG. 7a). The clamshell was made from steel which was hardened after machining to a Rockwell C hardness of about 65. All surfaces of the hardened clamshell were then ground flat to within +/−0.0005 inch to ensure flat and parallel surfaces. Before actual bonding took place, the clamshell containing a dummy cell package was run through the rolling mill to adjust the bite or gap of the rollers.

With the clamshell 54 heated to 500° C. by means of heated platens of a vertical press, the cell sandwich 32 was inserted inside the clamshell followed by immediate light pressure on the clamshell 54 to prevent the package from bowing due to thermal expansion mismatches. If the package bows there is a chance the spheres might shift out of place. The light pressure was also applied to ensure good thermal contact between the clamshell and heated platens.

After one minute of preheat at about 500° C., the clamshell 54 containing the cell package 32 was removed by means of a tongued fork (as in FIGS. 7d–7e) and placed near the roll press 48 (as in FIG. 4a). The clamshell 54 was then guided through the roll press 48. One pass through the rollers was sufficient to bond the spheres (4 in FIGS. 4a and 4b). After front roller bonding, the cell was processed according to operating procedures as described in the '319 patent.

A clarifying note on the importance of the clamshell is provided at this point. Previous to the above front roller bonding tests, a series of tests were conducted which tried unsuccessfully to affix a ~0.0005 inch thick aluminum foil to the backsides of the spheres by using the same rolling mill as above. This process step is called back bond (and is discussed with respect to FIG. 1f as well as hereinafter). The back bond step completes the electrical circuit of the solar cell since the front foil is connected to the n-type doped layer and the back foil is connected to the p-type core. We believe these tests failed in part because the process lacked a functional clamshell design.

An acceptable clamshell design consists of two thick metal plates (e.g., 0.300 inch thick per plate for the front roller bond clamshell illustrated in FIG. 7a) hinged on one side. Alternatively, pins as illustrated in FIGS. 8a–8c can be used. The hinge prevented the plates of the clamshell from sliding and creating excessive tangential shear forces on the cell sandwich. In other words, the hinge performed the same function as pins 70a–b in FIG. 8a. It was discovered in the unsuccessful tests that excessive tangential shear forces (i.e., force $F_2$ in FIG. 10b) for roller bonding impede the bonding process.

If the mass of the clamshell is much larger than the cell sandwich, it is quite possible that maintaining the set point temperature of about 500° C. during the time the clamshell leaves the preheat furnace and enters the rolling mill can be accomplished without the assistance of additional heaters. The heaters would increase the cost of the clamshell as well as complicate its movement if electrical wires were attached.

The clamshell plates must also be thick enough and strong enough to resist plastic deformation which will ensure that the force exerted by the rollers is being evenly distributed across the cell. A bow in the plates induced by the rollers could result in non-uniform forces. For example, if part or all of the available rolling forces are being diverted to flattening the clamshell, insufficient forces may be left to bond the foil to the spheres.

So the concept and design of the clamshell can be somewhat important to the success of roller bonding. The clamshell used in the unsuccessful test did not have a hinge (or other means for preventing excessive lateral movements such as pins) nor was the thickness and hardness of the plates sufficient to prevent bowing of the plates. The clamshell used in the front roller bonding tests incorporated all of the above attributes and, thus, was a much improved design.

Although the clamshell has played an important role in the cells which have been processed until now, we envision a process which can be performed without a clamshell as was previously discussed with reference to FIGS. 4a and 4b. To eliminate the clamshell, the force exerted by the roll press will have to be engineered so that the bond can occur without damaging the cells.

To demonstrate the success of the process, both the open-circuit voltage output and short-circuit current output of the cells were measured. These results were better than cells made with the hydraulic press method. These improved cell parameters can be possibly explained if the roller bond method induces less mechanical damage compared to the press method. Besides the reduced mechanical damage, the roller bond method is also more adaptable to mass production with its continuous, linear motion allowing for smooth material flow without the need for any vertical bonding motion as in the press method.

The method of the present invention can also be utilized with the back bond process as described above with respect to FIG. 1f. Further details regarding the back bond process are provided in co-pending application Ser. No. 08/279,572 (TI-19516), incorporated herein by reference. As with the front bond process, a cell sandwich is formed as illustrated in FIGS. 11a–11d.

Figure 11C:
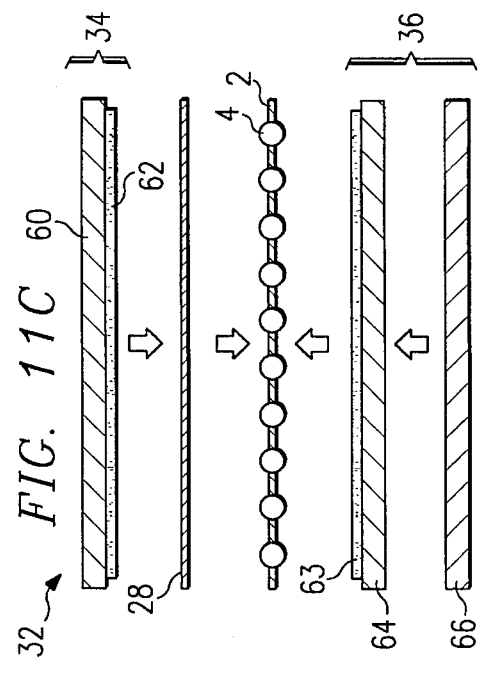
FIG. 11a–11d illustrates variations of a cell sandwich which can be utilized for the back bond process.
Figure 11D:
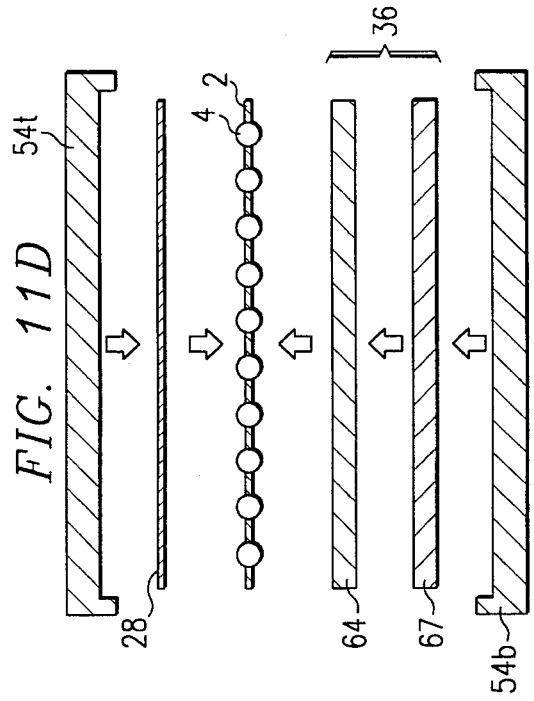
Figure 11A:
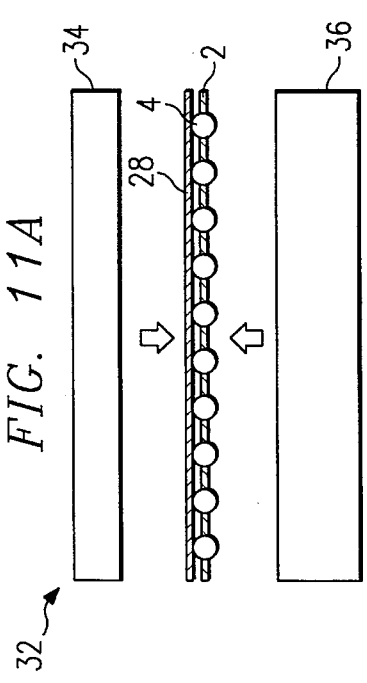

Referring first to FIG. 11a, the cell sandwich 32 includes upper pressure pad 34, lower pressure pad 36 and the cell being manufactured which includes first conductive sheet 2, solar members 4 and second conductive sheet 28. The cell may be a 300 cm² as shown in FIG. 2c. As before, the pressure pads 34 and 36 act as a cushion so that the spheres 4 are not damaged during compression.

Figure 11B:
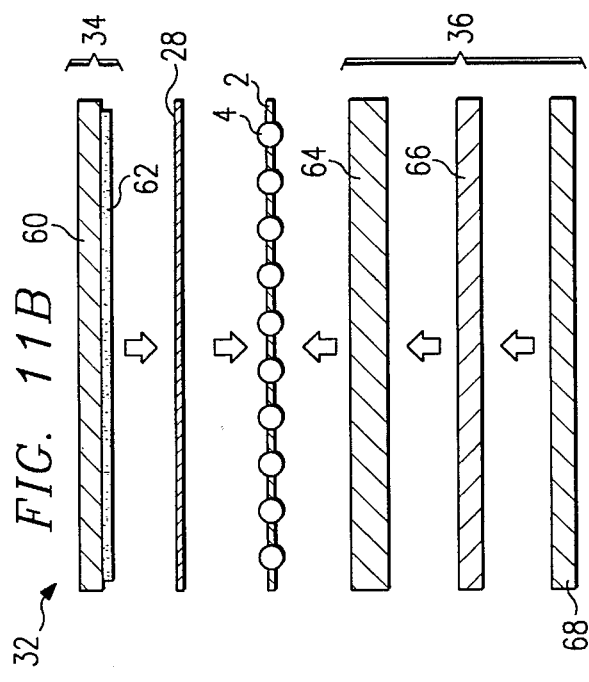

FIG. 11b illustrates a first of the many pressure pad configurations which can be utilized for the back bond process. The layers illustrated in FIG. 11b are summarized in Table 2.

TABLE 2

| Element | Material | Dimensions (inches) |
|---|---|---|
| Upper Pad 34 | Stainless steel 60 (oxidized) | 6.0 × 14.375 × 0.002 |
| | Plaster 62 | 6.0 × 14.375 × 0.001 ± 0.0005 |
| Back Foil 28 | Aluminum | 6.00 × 12.125 × 0.0005 |
| Lower Pad 36 | Aluminum 64 (oxidized) | 6.0 × 14.375 × 0.002 |
| | Oxide on Aluminum 64 | ~0.000060" thick |
| | Aluminum 66 (oxidized) | 6.0 × 14.375 × 0.008 |
| | Oxide on Aluminum 66 | ~0.000020" thick |
| | Stainless steel 68 (oxidized) | 6.0 × 14.375 × 0.002 |

An alternate embodiment cell sandwich is illustrated in FIG. 11c. In this embodiment, a plaster layer 63 (e.g., with dimensions of 6.00"×14.375"×0.001"±0.0005") is included on aluminum layer 64. In addition, the stainless steel layer 68 can be eliminated (as shown) if the oxide thickness on aluminum layer 66 is increased to say 0.000120".

FIG. 11d illustrates a cell sandwich 32 which is disposed between top clamshell plate 54t and bottom clamshell plate 54b. In this embodiment, the top clamshell plate 54t is coated with a ceramic release coating. This coating will directly abut back foil 28. The lower pressure pad 36 includes oxidized aluminum layer 64 and raw aluminum layer 67. As with the top plate, bottom clamshell plate 54b is coated with a ceramic-like coating. This embodiment does not require stainless steel sheets.

As discussed above with respect to FIG. 1e, a plurality of apertures have been defined in the insulating layer 20. These apertures will expose a portion of the sphere as also described above. The exposed portion of the sphere 4 is affixed to the second conductive sheet 28 by compressing the cell sandwich.

Prior to performing the compression step, the cell sandwich 32 may have light pressure applied to ensure good thermal contact between the clamshell 54 and the foil sheets 2 and 28. This intermediate pressure step can be performed using a vertical press and is usually included when using heated platens of a vertical press as the heating source. This step can perhaps be avoided if the furnace design provides a good thermal environment for heating cell sandwich 32 and/or clamshell 54. When a clamshell 54 is heated using an infrared heating source, no intermediate pressure step is needed. The weight of top plate 54t enhances good heat transfer.

The compression step to form the back bonds can be performed by use of a vertical press as described in the '319 patent (and as illustrated in FIG. 12a) or more preferably by a roll press as described above and as illustrated in FIG. 12b. As with the front bond process, the combination of the pressure and the heat will cause the conductive sheet 28 to bond to the spheres 4.

In the preferred embodiment, the electrical contact 26 and the second conductive sheet 28 are formed from the same sheet of material. In an alternate (less preferred) embodiment, this process can be performed in two steps.

In the first step, the electrical contact 26 is formed by compressing a conductive sheet (preferably aluminum) as discussed herein. That is, the conductive sheet may be compressed by using either a press ('319 patent) or a rolling device (described herein). The excess of the conductive sheet is then removed leaving a conductive pad 26 affixed to the core 12 of sphere 4.

A second conductive sheet 28 (preferably aluminum) is then positioned over the electrical contact 26. The aluminum sheet 28 and cell sandwich 32 are then heated to a temperature between about 400° C. and 450° C. (preferably about 420° C.). The heated sheet 28 is then compressed against the array as described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of affixing semiconductor members to a foil matrix comprising the steps of:
   preparing a cell sandwich having semiconductor members mounted in apertures on said foil matrix inside upper and lower pressure pads:
   disposing said cell sandwich within a clamshell prior to affixing said semiconductor members to said foil matrix;
   heating said cell sandwich; and
   affixing said semiconductor members to said foil matrix by directing said cell sandwich within said clamshell through a roll press thereby compressing said cell sandwich.

2. The method of claim 1 wherein said upper and lower pressure pads each comprise a compliant sheet.

3. The method of claim 2 wherein said complaint sheet is coated with a release coat layer.

4. The method of claim 3 wherein said compliant sheet comprises an aluminum sheet.

5. The method of claim 3 wherein said release coat layer comprises a plaster layer.

6. The method of claim 1 wherein a surface of said pressure pads is modified so as to prevent adherence to other materials in said cell sandwich.

7. The method of claim 1 wherein said upper pressure pad comprises a plurality of layers, said layers comprising:
   a stainless steel sheet;
   a first sheet of aluminum, said first sheet of aluminum having an oxide layer formed thereon;
   a first plaster layer;
   a second sheet of aluminum; and
   a second plaster layer;
and said lower pressure pad comprises a plurality of layers comprising:
   a stainless steel sheet;
   a sheet of aluminum, said sheet of aluminum having an oxide layer formed thereon; and
   a plaster layer.

8. The method of claim 1 wherein said upper pressure pad and lower pressure pad each comprise an oxidized aluminum sheet with a plaster release coat.

9. The method of claim 1 wherein said step of heating said cell sandwich comprises the step of heating said cell sandwich to between about 500° and 540° C.

10. The method of claim 1 wherein said heating step is performed prior to said affixing step.

11. The method of claim 1 wherein said heating step is performed after said affixing step.

12. The method of claim 1 and further comprising the step of heating said clamshell prior to disposing said cell sandwich within said clamshell.

13. The method of claim 1 wherein said step of heating said cell sandwich is performed before said step of disposing said cell sandwich within said clamshell.

14. The method of claim 1 wherein said step of heating said cell sandwich is performed after said cell sandwich is disposed within said clamshell.

15. The method of claim 1 wherein said clamshell includes a stepped portion such that the thickness of said clamshell is not uniform.

16. The method of claim 1 wherein said clamshell includes a release coat layer formed upon a region which abuts said cell sandwich.

17. The method of claim 1 wherein a surface of said clamshell is modified so as to prevent adherence to other materials in said cell sandwich.

18. The method of claim 1 wherein said roll press comprises a first roller with a diameter and a second roller with said diameter.

19. The method of claim 18 wherein said diameter is between about 3 and 18 inches.

20. The method of claim 18 wherein said roller includes a stepped portion such that the diameter of said roller is not uniform circumferentially or laterally.

21. The method of claim 18 wherein one of said first and second rollers is heated to between about 200° and 550° C.

22. The method of claim 18 wherein a surface of at least one of said first and second rollers is modified so as to prevent adherence to other materials in said cell sandwich.

23. The method of claim 22 wherein at least one of said first and second rollers is coated with a release coat layer.

24. The method of claim 1 wherein said roll press comprises a first roller with a first diameter and a second roller with a second diameter wherein said first diameter is different than said second diameter.

25. The method of claim 1 wherein said step of directing said cell sandwich through a roll press comprises holding said cell sandwich stationary and moving a roller over said cell sandwich.

26. The method of claim 1 wherein said roll press compresses a plurality of top rollers and a plurality of bottom rollers.

27. The method of claim 1 and further comprising the step of heating said clamshell prior to said step of disposing said cell sandwich within said clamshell.

28. The method of claim 27 wherein said step of heating said cell sandwich is performed after said step of disposing said cell sandwich within said clamshell.

29. The method of claim 1 wherein said heating step is performed before said disposing step.

30. A method of affixing a plurality of spheres to a foil matrix comprising the steps of:
   providing a foil including a plurality of apertures formed in a plurality of rows, each of said apertures having a sphere disposed therein;
   preparing a cell sandwich by placing said foil matrix between upper and lower pressure pads;
   disposing said cell sandwich within a clamshell;
   heating said cell sandwich; and
   sequentially compressing each row within said plurality of rows of spheres within said heated cell sandwich to affix said spheres to said foil matrix wherein said compressing step comprises directing said cell sandwich within said clamshell through a roll press thereby sequentially compressing said rows of spheres.

31. The method of claim 30 wherein said apertures are formed in a hexagonal configuration.

32. A method of affixing doped silicon spheres to a foil matrix which includes a plurality of apertures, said method comprising the steps of:

loading said foil matrix with a plurality of doped silicon spheres;

positioning said loaded foil matrix between upper and lower pressure pads to form a cell sandwich;

disposing said cell sandwich between upper and lower plates of a clamshell, said clamshell including a stepped portion;

heating said cell sandwich;

affixing said silicon spheres to said foil matrix by directing said clamshell, including said cell sandwich, through a roll press thereby compressing said cell sandwich; and cooling said cell sandwich.

* * * * *